United States Patent
Wacker

(10) Patent No.: US 7,589,599 B2
(45) Date of Patent: Sep. 15, 2009

(54) HEATING SYSTEM FOR A DOUBLE-OVENIZED OSCILLATOR ON A SINGLE PRINTED CIRCUIT BOARD

(75) Inventor: Michael F Wacker, Mechanicsburg, PA (US)

(73) Assignee: Vectron International, Inc., Hudson, NH (US)

( * ) Notice: Subject to any disclaimer, the term of this patent is extended or adjusted under 35 U.S.C. 154(b) by 77 days.

(21) Appl. No.: 11/876,835

(22) Filed: Oct. 23, 2007

(65) Prior Publication Data

US 2009/0102567 A1 Apr. 23, 2009

(51) Int. Cl.
*H01L 41/00* (2006.01)
*H03B 1/00* (2006.01)
*H03L 1/04* (2006.01)

(52) U.S. Cl. .............................. 331/69; 331/66; 331/70; 331/158; 310/315

(58) Field of Classification Search .................... 331/35, 331/66, 68–70, 158, 159, 176; 310/314, 310/315, 318
See application file for complete search history.

(56) References Cited

U.S. PATENT DOCUMENTS

| | | | |
|---|---|---|---|
| 6,147,565 A | 11/2000 | Satoh et al. | |
| 6,208,213 B1 * | 3/2001 | Anastasyev et al. | 331/69 |
| 6,501,340 B1 | 12/2002 | Flood | |
| 6,621,361 B1 | 9/2003 | Fry | |
| 6,642,803 B2 | 11/2003 | Jeong | |
| 6,784,756 B2 | 8/2004 | Villella | |
| 6,870,430 B2 | 3/2005 | Nakamura et al. | |
| 7,310,024 B2 | 12/2007 | Milliren et al. | |

OTHER PUBLICATIONS

PCT Search Report dated Dec. 23, 2008 of Patent Application No. PCT/US2008/080569 filed Oct. 21, 2008.
Reinhardt, Timo, "Application and Means of Operation of Double OCXO", [online] [retrieved on Nov. 15, 2005] Retrieved from the internet <URL:http://www.foq.de/english/news/ARTICLES/archive/do_ocxo.htm>.

* cited by examiner

*Primary Examiner*—David Mis
(74) *Attorney, Agent, or Firm*—Vern Maine & Associates

(57) ABSTRACT

A system is provided for the regulation of temperature of a crystal oscillator, that system having a thermally conductive support disposed upon a substrate and upon which is disposed the crystal oscillator, an array of thermal vias disposed around the crystal oscillator within the substrate, at least one primary heater communicating with the support, a thermal enclosure communicating with the array of thermal vias, and a at least one secondary heater communicating with the enclosure.

16 Claims, 10 Drawing Sheets

HEATING SYSTEM FOR A DOUBLE-OVENIZED OSCILLATOR ON A SINGLE PRINTED CIRCUIT BOARD

FIELD OF THE INVENTION

The invention relates to crystal oscillators, and more particularly, to a heating system for a double-oversized oscillator on a printed circuit board.

BACKGROUND OF THE INVENTION

Oven controlled Xtal Oscillators (OCXOs) are used in high frequency applications. The Double oven construction ensures a stable operating temperature, diminishing temperature fluctuations that would affect the function of the piezoelectric resonator, introducing error into the frequency. The double oven configuration operates by maintaining both ovens above the maximum operating ambient temperature. The crystal characteristics are matched to this temperature for operation at a 0 slope point on the frequency— temperature curve. This curve is commonly represented by a third or fourth order polynomial describing the dependence of frequency on temperature. The nature of this dependency results in even small fluctuations in temperature producing noticeable effects on frequency stability.

Placing the oscillator crystal within two ovens allows the secondary (external oven) to insulate the primary oven (internal) from ambient temperature fluctuations. Such a system, is however, complex and expensive to build, requiring multiple printed circuit boards. Associated with multiple boards are the complexities of connecting those boards. The use of multiple boards also demands larger packages, complicating efforts to decrease the volume of the housing.

What is needed, therefore, are techniques for providing temperature stability for an oscillator device configured on a single printed circuit board.

SUMMARY OF THE INVENTION

One embodiment of the present invention provides a system for the regulation of temperature of a crystal oscillator, the system comprising: a thermally conductive support disposed upon a substrate and upon which is disposed the crystal oscillator, an array of thermal vias disposed around the crystal oscillator within the substrate, at least one primary heater communicating with the support, a thermal enclosure communicating with the array of thermal vias, and at least one secondary heater communicating with the enclosure.

Another embodiment of the present invention provides such a system further comprising an oscillator housing.

A further embodiment of the present invention provides such a system further comprising oscillator circuit components disposed within the enclosure.

Still another embodiment of the present invention provides such a system further comprising temperature control devices communicating with the support.

One embodiment of the present invention provides a crystal oscillator, the oscillator comprising: a single printed circuit board, a primary heater, metallic plane disposed on the single printed circuit board in thermal communication with the heater, a piezoelectric resonator; disposed upon the metallic plane, a primary thermal enclosure disposed about the metallic plane, and at least one secondary heater, disposed externally to primary thermal enclosure.

Another embodiment of the present invention provides such a crystal oscillator further comprising a secondary enclosure housing; the housing encompassing the printed circuit board.

A further embodiment of the present invention provides a crystal oscillator further comprising oscillator circuitry with at least one circuit component disposed within the primary thermal enclosure.

Still another embodiment of the present invention provides such a crystal oscillator further comprising thermal vias disposed within the printed circuit board.

A still further embodiment of the present invention provides such a system wherein the thermal vias communicate with a thermally conductive inner layer.

Yet another crystal oscillator further comprising a proportionally controlled temperature sensing and control system whereby the metallic plane is maintained at an oscillator operating temperature.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
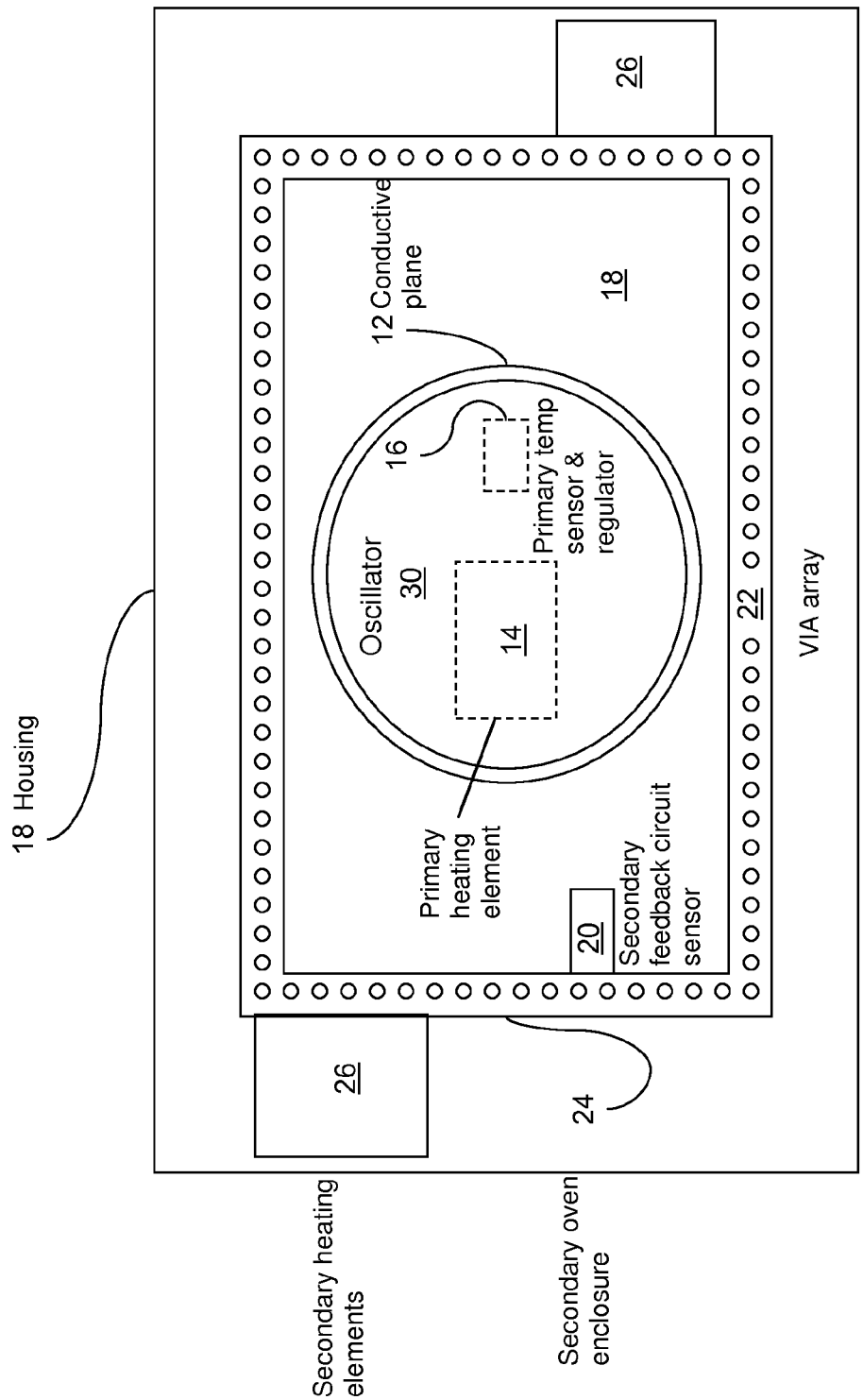
FIG. 1 is a block diagram illustrating a plan view of a double oven oscillator device on a single printed circuit board configured in accordance with one embodiment of the present invention.
Figure 2:
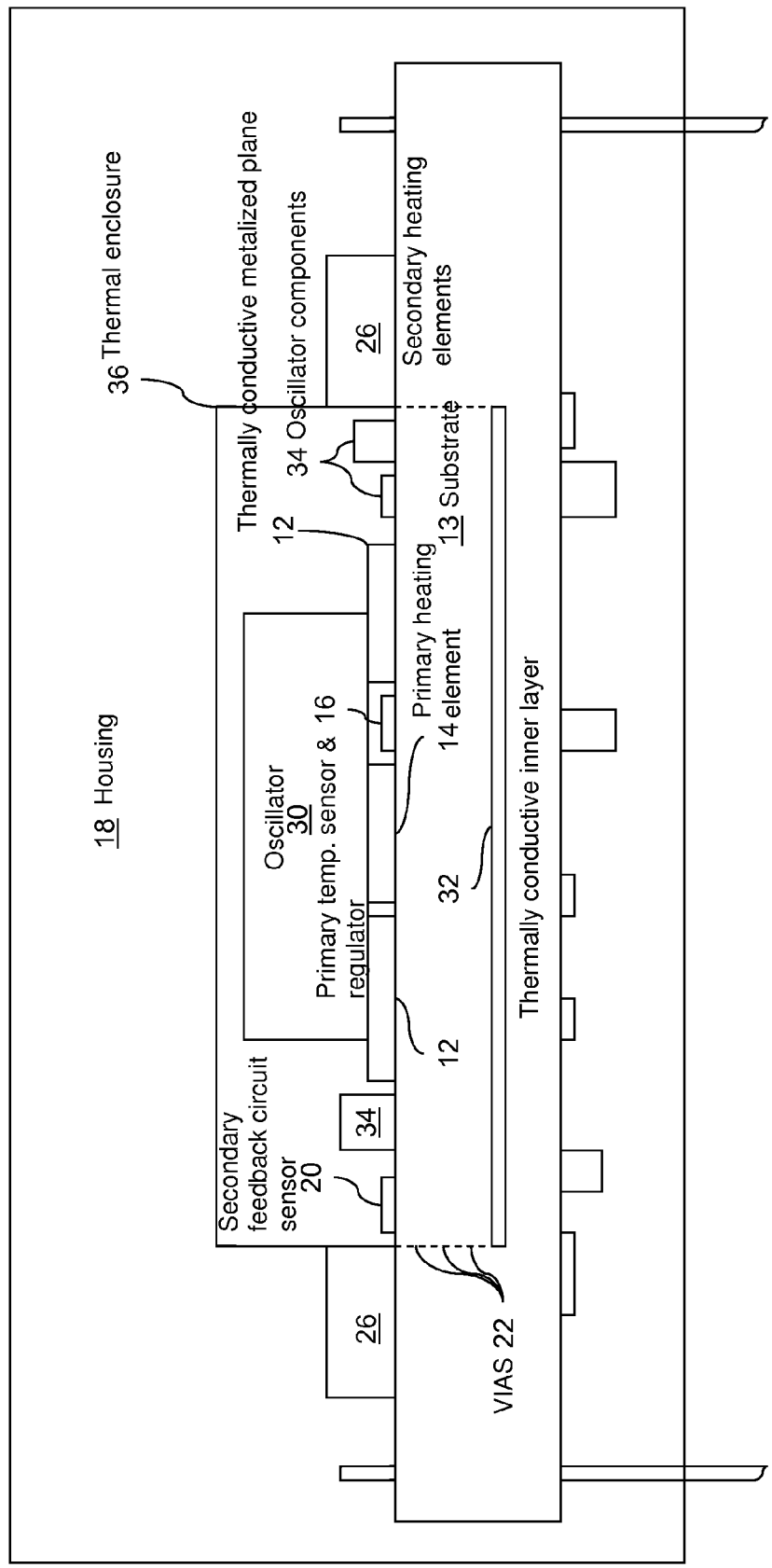
FIG. 2 is a block diagram illustrating a cross sectional elevation view of a pseudo double oven oscillator device on a single printed circuit board configured in accordance with one embodiment of the present invention.

As illustrated in FIGS. 1 and 2, a crystal oscillator 30 requiring high temperature stability is in thermal contact with a heated, thermally conductive plane 12 disposed on a board or substrate 13, which is itself disposed in a housing 18. The metallized plane 12 is heated by a primary heating element 14, in one embodiment this heating element 14 is a thermal dissipating heat element equipped with a temperature sensor and regulator 16. In one embodiment the temperature sensing and regulation functions are performed by a controlled feedback system. A via array of thermal vias 22 is disposed on the board surrounding the plane 12. In one embodiment of the present invention the array may be square, circular, oval, rectangular, or another suitable geometry configured to be used with a thermal enclosure 36. The array may be disposed about a periphery of a desired secondary oven enclosure 24. Such vias may be conductors of ground current. In an embodiment illustrated in FIG. 2, other temperature sensitive components 34 may be disposed within the array. The thermal vias described may be thermally conductive material other than that of the circuit board, such as metals, whereby heat may flow. Examples of via material include copper and thermally conductive epoxy.

In one embodiment, illustrated in FIG. 2, a thin walled metal can 36 or other suitable enclosure is soldered or thermally coupled to the vias 22 thereby forming a secondary enclosure around the heated plane 12 and the crystal 30 and other temperature sensitive components 34. A secondary heating system having one or more heating elements 26 and an associated feed back circuit sensor 20 heats the vias 22 and the thin walled metal can 36. In one embodiment of the present invention, such heating elements 26 are thermal dissipating elements, while other embodiments may utilize transistors, resistors, and could be either bipolar or mosfets. The vias 22 that are thus heated form a thermal wall or barrier, and provide a path for the transfer of heat to a thermally conductive inner layer 32 disposed within the board. The crystal 30 and oscillator components 34 are thus enclosed in a thermal envelope heated to a desired temperature. One embodiment of the present invention thus provides double oven assembly having an "inner" oven assembly surrounded by a heat shield on all sides, emulating a conventional double oven assembly. In one embodiment of the present invention, an additional outer housing is provided, passively shielding the double oven assembly.

In one embodiment of the present invention, a pre-tinned crystal flange is soldered to a metal plane. At least one heater and temperature sensing thermistor is disposed in direct contact with the metal plate, and beneath a glassed portion of a crystal enclosure. An oscillator circuit, in one embodiment a Colpitts oscillator circuit, is placed around the crystal enclosure. Together, these elements form a primary oven. The metal plane, in such an embodiment is configured to be disposed in the top most layer, and is disposed in that area beneath the crystal. Two additional heaters may be disposed and coupled to the thermal via arrays described above. In one such embodiment the heaters are soldered to a copper square surrounding the metal plane and in which the array is disposed. A thermally conductive can is soldered to the via array. Thermal vias disposed in a thin copper square may be provided to transmit heat to an inner layer. Controlled depth vias or other similar structures may be used to provide crystal attachment without compromise of the heated inner layer. In such an embodiment, the copper layer may be coupled to a temperature sensor.

In an alternative embodiment, an LPP (Low Profile Package) crystal package can be used wherein glass is omitted. The underside of the pack is metal or ceramic and is soldered to the PCB plane. In such an embodiment, the thermistor is placed to the side of the crystal.

EXAMPLE 1

A unit designed using the binary oven (dual oven) concept has been tested. The unit thus tested includes a board assembly housed in a C0-8 eurocase enclosure. The crystal used is a $3^{rd}$ overtone 5 MHz SC in an HC-37/U holder.

Figure 3:
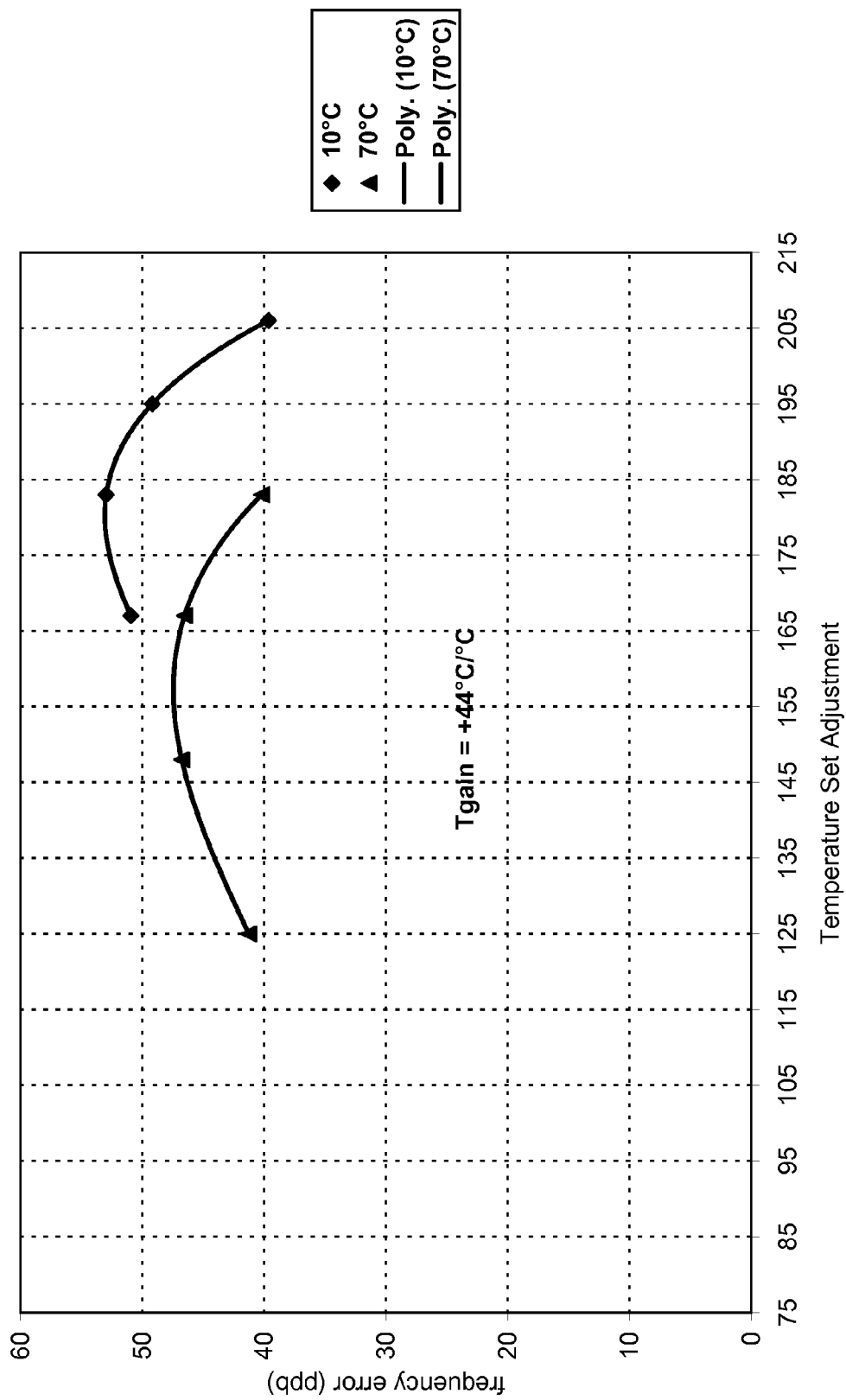
FIG. 3 is a graph illustrating a thermal analysis of an enabled primary oven of a double oven oscillator device on a single printed circuit board configured in accordance with one embodiment of the present invention.
Figure 4:
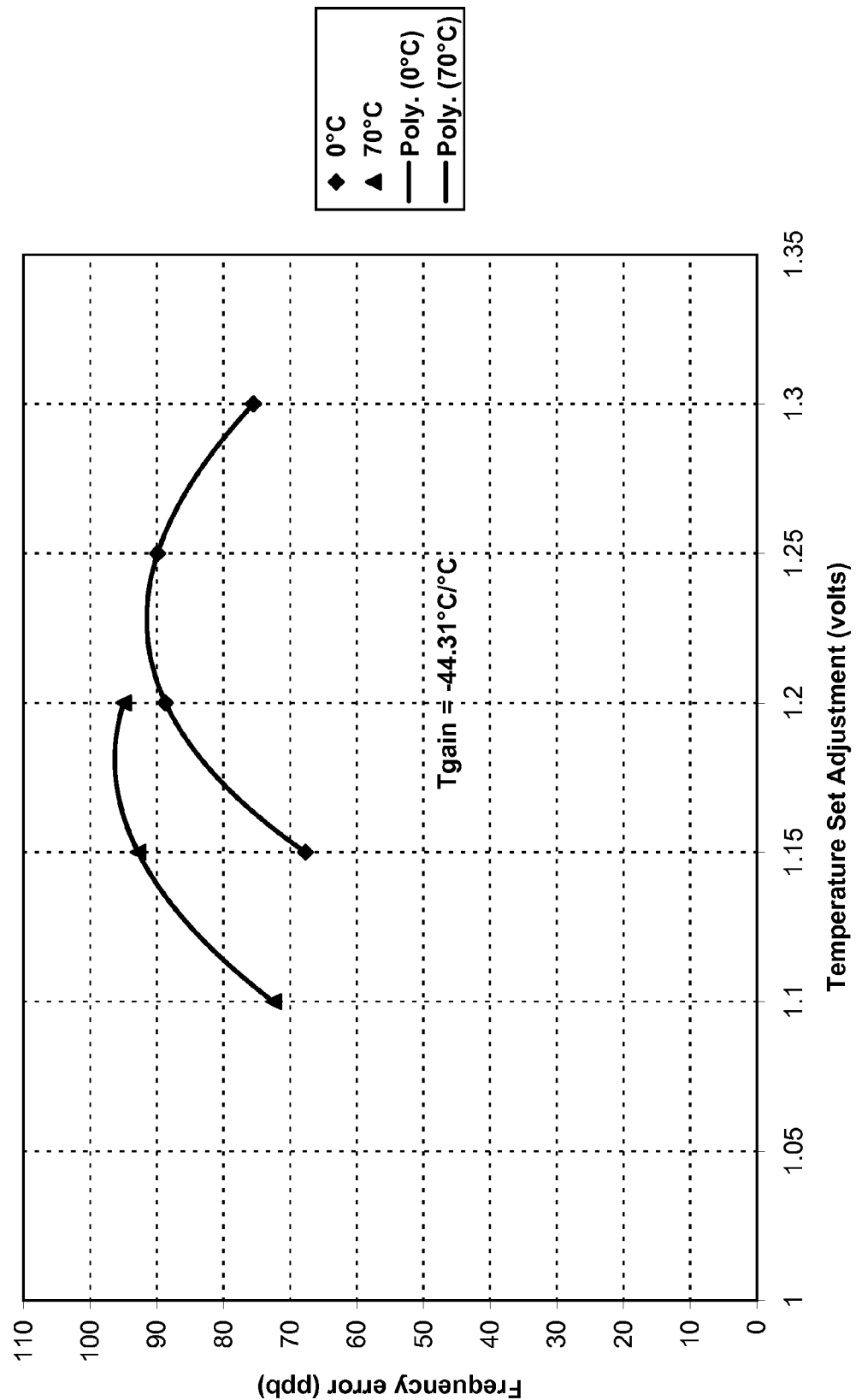
FIG. 4 is a graph illustrating a thermal analysis of an enabled secondary oven of a double oven oscillator device on a single printed circuit board configured in accordance with one embodiment of the present invention.

Thermal analysis with primary (inner) oven enabled and secondary (outer) oven disabled is illustrated in FIG. 3. As shown, results are provided for tests of the design at 10° C., 35° C. and 70° C. This is compared with Thermal analysis results illustrated in FIG. 4, wherein primary oven is disabled while the secondary oven is enabled. The thermal gain at the crystal in either scenario is comparable to that of a standard single-oven eurocase OCXO.

Figure 5:
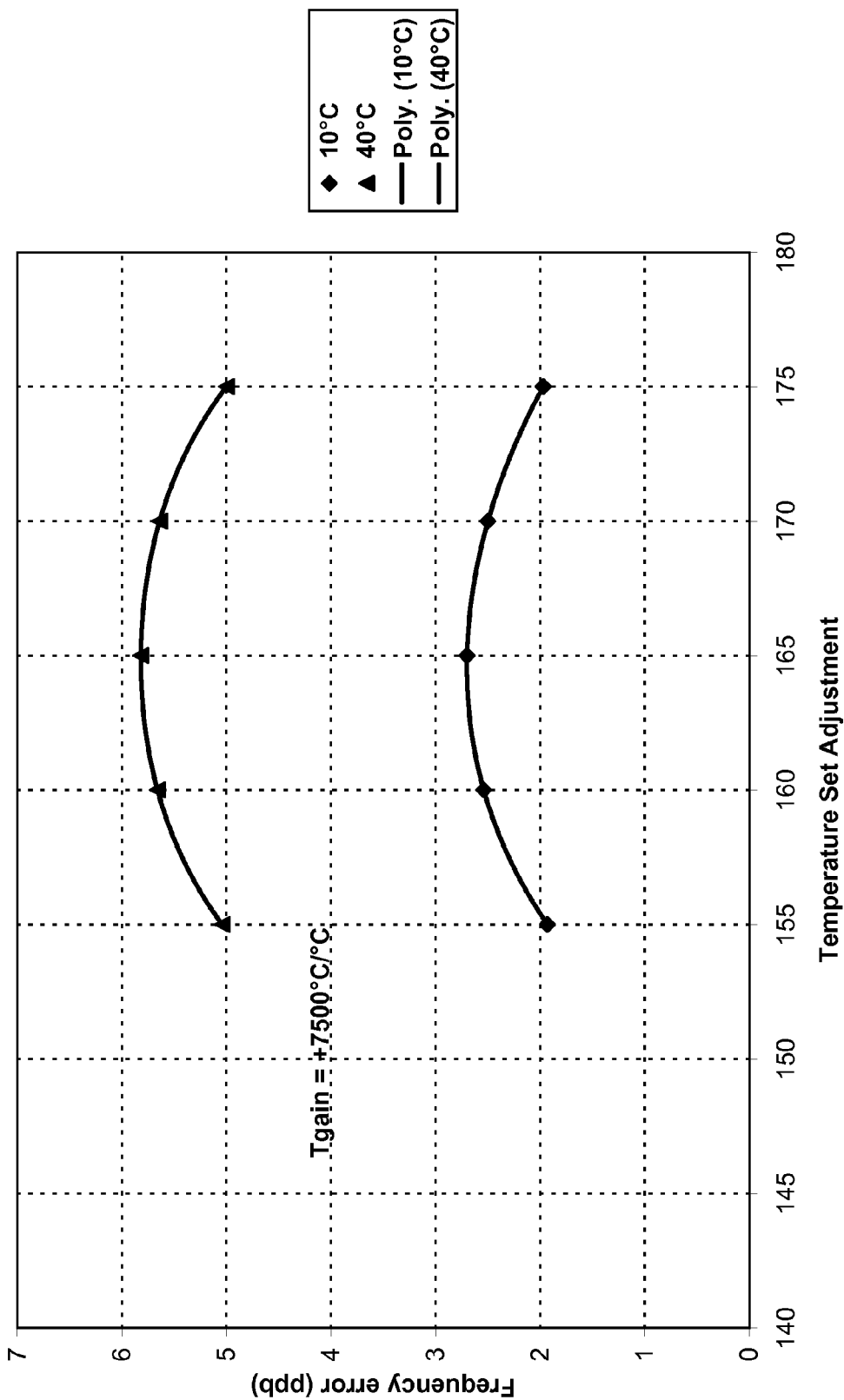
FIG. 5 is a graph illustrating a thermal analysis of enabled primary and secondary ovens of a double oven oscillator device on a single printed circuit board configured in accordance with one embodiment of the present invention.

The thermal analysis illustrated in FIG. 5 shows the performance with both ovens enabled. Dramatic increase is noted in thermal gain at the crystal, with the negligible change in the TempCo magnitude.

Figure 6:
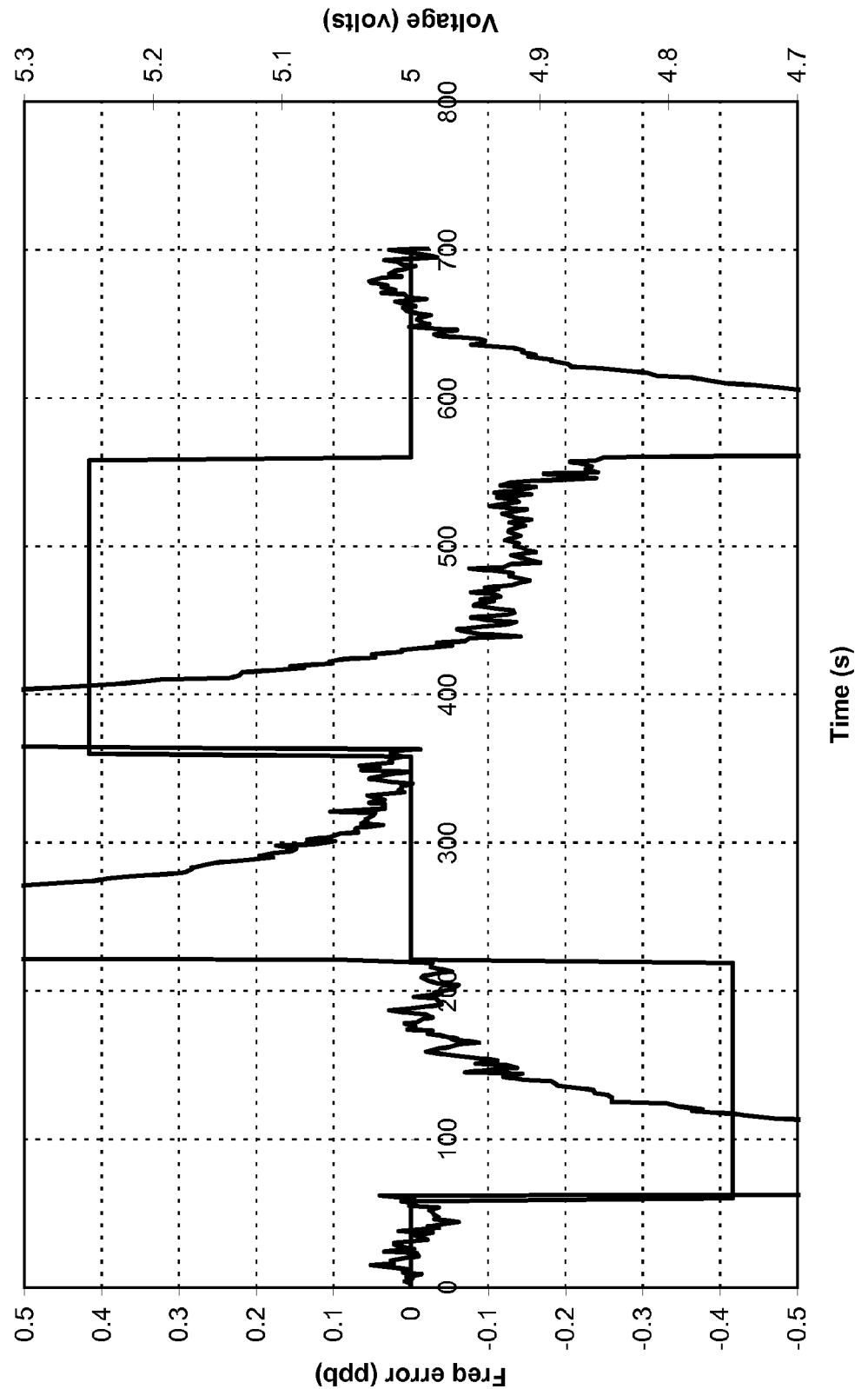
FIG. 6 is a graph illustrating Frequency Voltage stability for a ±5% voltage change in power supply of a double oven oscillator device on a single printed circuit board configured in accordance with one embodiment of the present invention.
Figure 7:
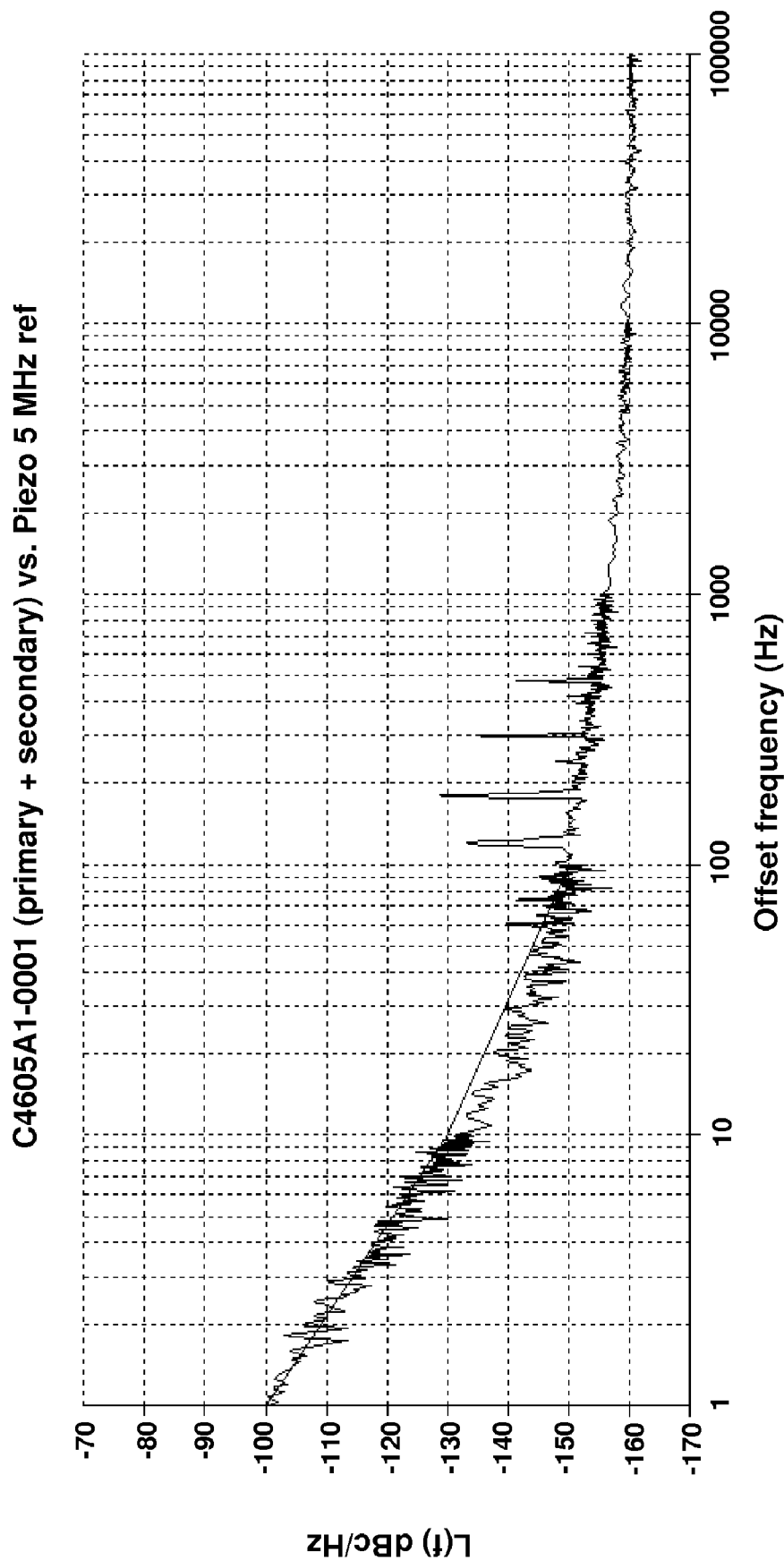
FIG. 7 is a graph illustrating Phase noise of a double oven oscillator device on a single printed circuit board configured in accordance with one embodiment of the present invention.
Figure 8:
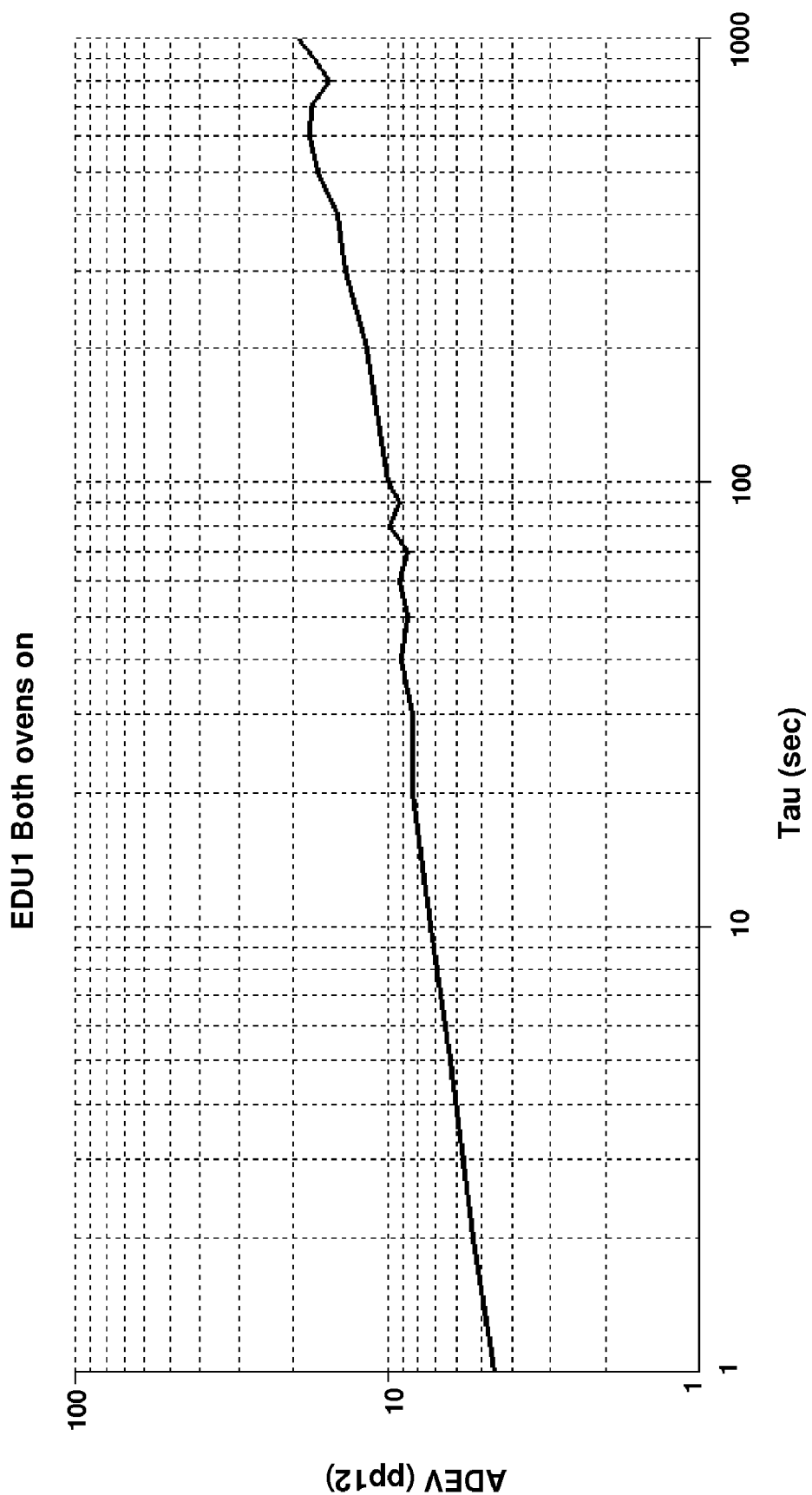
FIG. 8 is a graph illustrating Allan deviation of a double oven oscillator device on a single printed circuit board configured in accordance with one embodiment of the present invention.

Frequency-Voltage Stability for a ±5% change in supply voltage is illustrated in FIG. 6. Phase noise for such a device is illustrated in FIG. 7, Allan Deviation is illustrated in FIG. 8.

Figure 9:
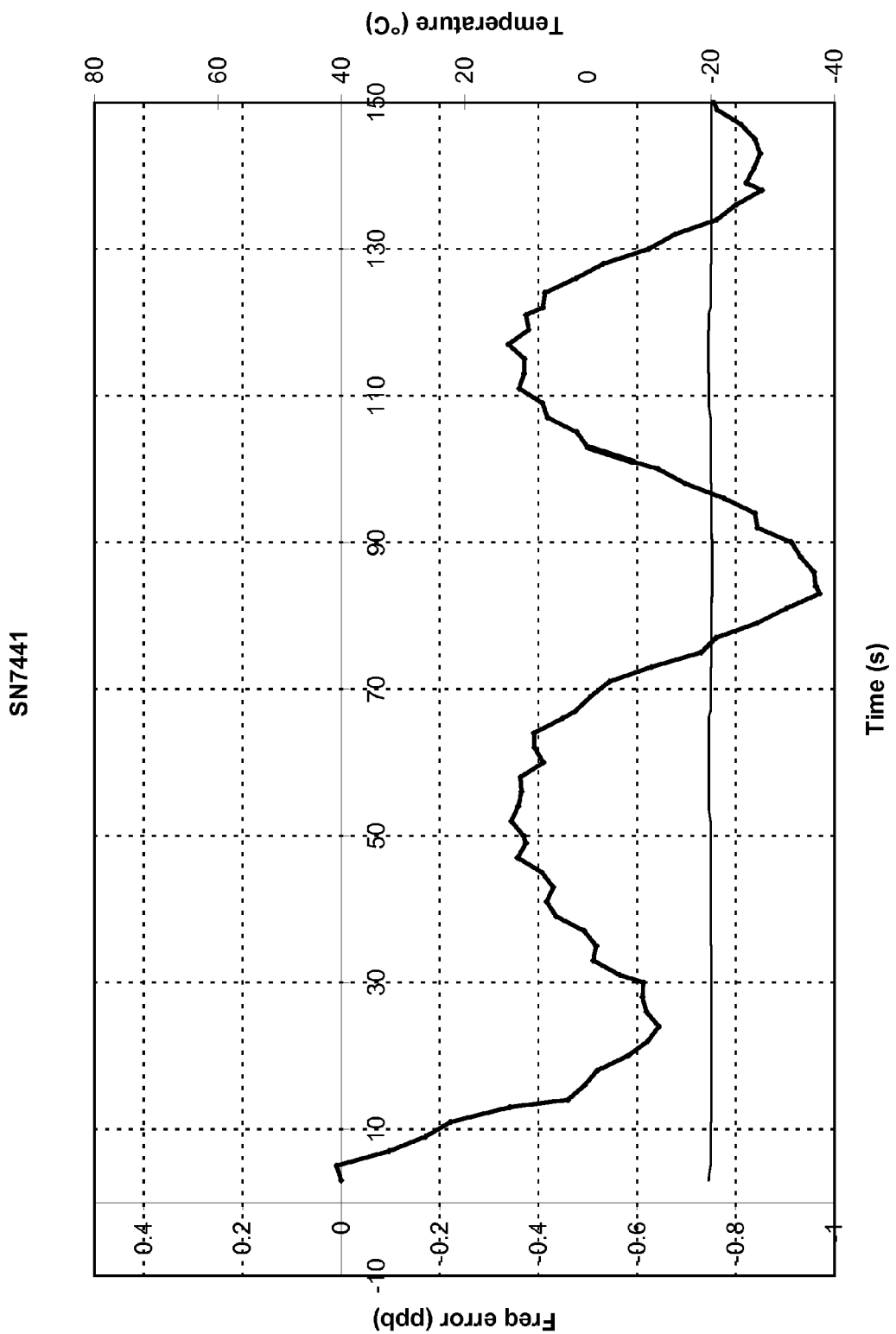
FIG. 9 is a graph illustrating the effect of air flow and $CO_2$ blast on a single oven oscillator device.
Figure 10:
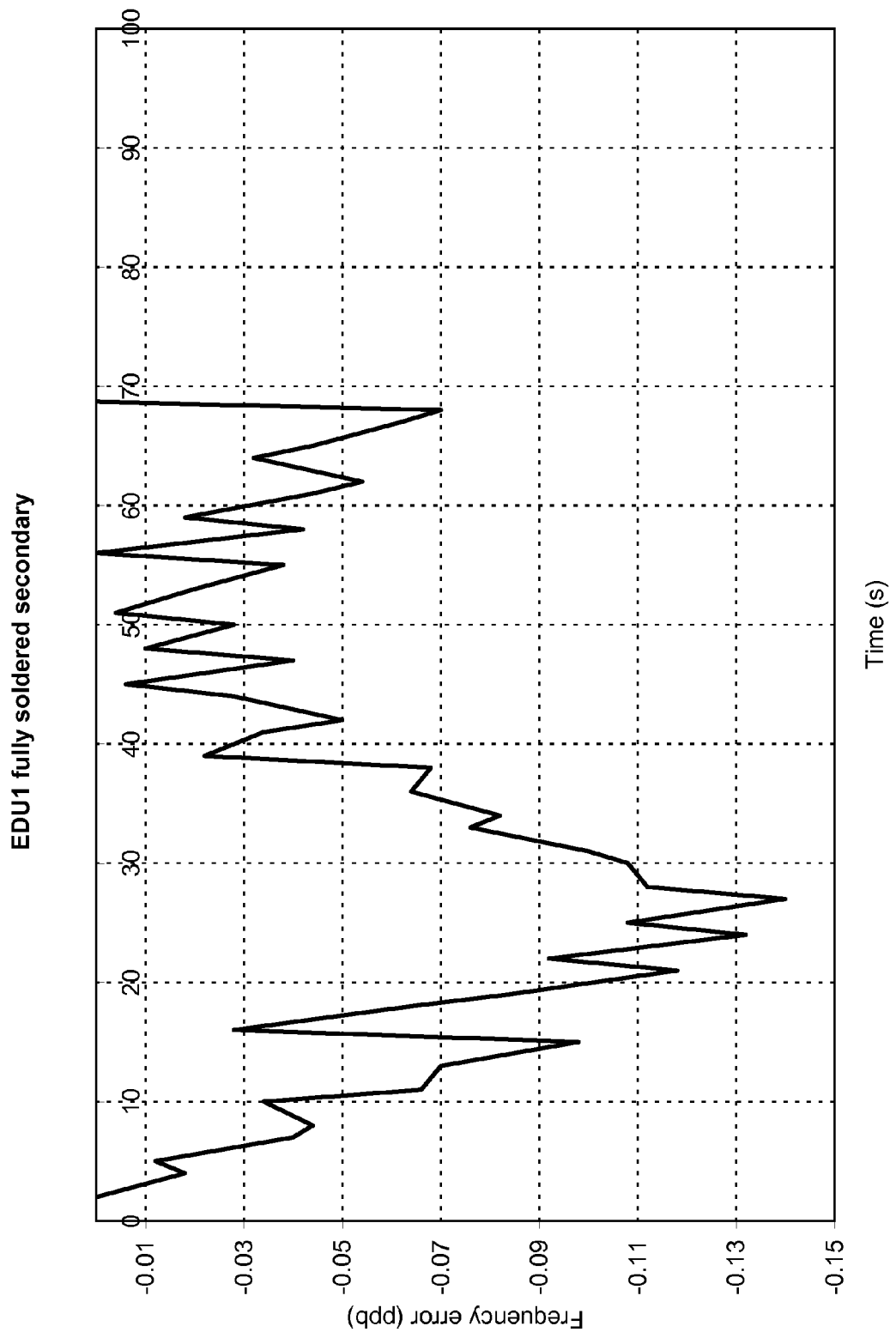
FIG. 10 is a graph illustrating the effect of air flow and $CO_2$ blast on a double oven oscillator device on a single printed circuit board configured in accordance with one embodiment of the present invention.

In the presence of airflow and $CO_2$ blasts, the frequency stability of the dual-heater device configured according to one embodiment of the present invention is markedly improved over the standard single-oven OCXO in the eurocase enclosure (both units are at +10° C.). The effect of airflow and $CO_2$ blast on a single oven is illustrated in FIG. 9. The effect on a double oven configured in accord with one embodiment of the present invention is illustrated in FIG. 10.

Based upon the results of the current implementation, the thermal gain at the crystal is on par with that of conventional double-ovens. Thus, it has been shown that adequate thermal isolation between multiple ovens can be achieved on a single standard construction PC board.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for the regulation of temperature of a crystal oscillator, the system comprising:
    a thermally conductive support disposed upon a substrate and upon which is disposed said crystal oscillator such that said crystal oscillator is in thermal contact with said thermally conductive support;
    an array of thermal vias disposed around said crystal oscillator within said substrate;
    at least one primary heater communicating with said support;
    a metallic plane disposed beneath a top surface of said substrate and in thermal communication with said thermal vias;
    a thermal enclosure communicating with said array of thermal vias; and
    at least one secondary heater communicating with said enclosure.

2. The system of claim 1 further comprising an oscillator housing.

3. The system according to claim 1 further comprising oscillator circuit components disposed within said enclosure.

4. the system according to claim 1 further comprising temperature control devices communicating with said support.

5. The system according to claim 1 wherein said primary heater and said secondary heater are controlled by first and second independent controllers.

6. The system according to claim 1 further comprising a first controller controlling said primary heater and a second controller controlling said secondary heater, and wherein said first controller communicates with said second controller.

7. The system according to claim 1 further comprising an insulating gas disposed within said enclosure.

8. The system according to claim 7 wherein said insulating gas is a gas selected from the group of gases consisting of air, nitrogen, argon and mixtures thereof.

9. The system according to claim 1 further comprising a solid insulator material disposed within said enclosure.

10. The system according to claim 1 wherein said substrate comprises a thermally insulating material.

11. The system according to claim 1 further comprising slots disposed in said substrate.

12. A crystal oscillator, said oscillator comprising:
a single printed circuit board;
a primary heater;
a metallic plane disposed on said single printed circuit board in thermal communication with said heater;
a piezoelectric resonator; disposed upon said metallic plane;
thermal vias disposed within said printed circuit board communicating with a thermally conductive inner layer;
a primary thermal enclosure disposed about said metallic plane; and
at least one secondary heater, disposed externally to said primary thermal enclosure.

13. The crystal oscillator according to claim 12, further comprising a secondary enclosure housing; said housing encompassing said printed circuit board.

14. The crystal oscillator according to claim 12 further comprising oscillator at least one circuit component disposed within said primary thermal enclosure.

15. The crystal oscillator according to claim 12 further comprising a temperature sensing and control system whereby said metallic plane is maintained at an oscillator operating temperature.

16. The crystal oscillator according to claim 15 wherein said temperature sensing and control system is proportionally controlled.

\* \* \* \* \*